United States Patent [19]
Lee

[11] Patent Number: 5,378,906
[45] Date of Patent: Jan. 3, 1995

[54] DYNAMIC RANDOM ACCESS MEMORY HAVING IMPROVED LAYOUT

[75] Inventor: Hee G. Lee, Seoul, Rep. of Korea

[73] Assignee: Goldstar Electron Co., Ltd., Cheongju, Rep. of Korea

[21] Appl. No.: 26,387

[22] Filed: Mar. 4, 1993

[30] Foreign Application Priority Data

Mar. 4, 1992 [KR] Rep. of Korea ............... 3546/1992

[51] Int. Cl.⁶ ............... H01L 29/68; H01L 29/78; H01L 29/92
[52] U.S. Cl. ............... 287/296; 257/308; 257/905; 257/907; 257/908
[58] Field of Search ............... 257/296, 300, 301, 303, 257/304, 305, 306, 307, 311, 905, 907, 908

[56] References Cited

U.S. PATENT DOCUMENTS

| | | | |
|---|---|---|---|
| 4,970,564 | 11/1990 | Kimura et al. | 357/23.6 |
| 5,014,103 | 5/1991 | Ema | 357/41 |
| 5,250,831 | 10/1993 | Ishii | 287/908 |

FOREIGN PATENT DOCUMENTS 55-150267 11/1980 Japan ............... 257/296

OTHER PUBLICATIONS

T. Ema et al., "3-Dimensional Stacked Capacitor Cell For 16M and 64M Drams", Dec. 11-14, 1988, pp. 592-599, IEDM 1988.

*Primary Examiner*—Ngan V. Ngo
*Attorney, Agent, or Firm*—Alan R. Loudermilk

[57] ABSTRACT

A dynamic random access memory having an improved layout capable of having a large storage capacity with a small memory cell area as well as preventing the occurrence of short-circuiting by an increase in the process margin, and a method of arranging memory cells of the same. Each active region includes a first diffusion region, a second diffusion region in common with an adjacent memory cell and a channel forming region located between the first and second diffusion regions. First diffusion regions of adjacent active regions are located at positions symmetrical with respect to the common second diffusion region, at a predetermined angle. Each of uniformly spaced bit lines has a protrusion having a predetermined width and length and extending from its one edge in a direction that the word lines extend. At the protrusion, one second diffusion region is disposed. Uniformly spaced word lines cross bit lines. Each capacitor is positioned between two adjacent bit lines and between two adjacent word lines. Each first contact hole is located on the center of each capacitor. Each bit line has a bent portion for preventing a short-circuiting caused by a contact with a protrusion of adjacent bit line. Each word line has a bent portion for preventing a short-circuiting caused by a contact with each corresponding first contact hole.

23 Claims, 11 Drawing Sheets

DYNAMIC RANDOM ACCESS MEMORY HAVING IMPROVED LAYOUT

BACKGROUND OF THE INVENTION

1. Field of the Invention

The present invention relates to dynamic random access memories (DRAMs), and more particularly to a dynamic random access memory with an improved layout in which essential elements may be efficiently arranged in a limited area so as to be suitable for a DRAM device of a mega-bit grade or greater, and also to a method of arranging memory cells in such a memory device.

2. Description of the Prior Art

As is well-known, the degree of integration in DRAMs generally has quadrupled every three years, and this tendency appears to be continuing. Although the memory capacity increases by a factor of four, the chip size typically increases by only about a factor of two as a result of highly sophisticated processing technology.

The capacitance of the capacitor serving as the location for storing information in a memory cell (in the form of millions of electrons), however, typically cannot be reduced with each subsequent generation due to the operational characteristics of DRAM circuits. Most of the currently available commercial products typically are designed to have a capacitance of about 20 femto Farads or more per cell. In order to reduce the area per cell and yet maintain the capacitance of the capacitors, most commercial DRAMs having four mega-bits or greater data storage use three-dimensional capacitors.

Figure 1:
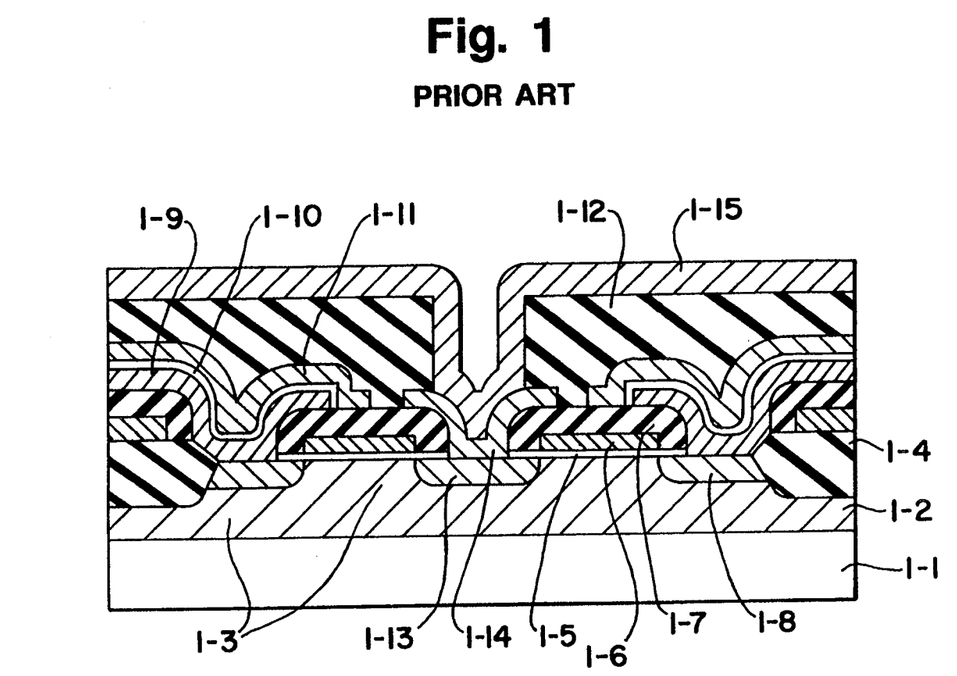
FIG. 1 is a sectional view of a conventional structure of a DRAM having stacked capacitors.

A conventional method of making a CMOS DRAM of four or sixteen mega-bits data storage capacity employing stacked capacitors will now be described with reference to FIG.

In accordance with this conventional method, on silicon substrate 1-1 is first formed well 1-2 of a predetermined conductivity type (in a CMOS type device, P and N type Thereafter, active regions 1-3 and field regions 1-4 are formed on silicon substrate 1-1 by what is known as a LOCOS (local oxidation of silicon) method. Over active regions 1-3 on the entire surface of silicon substrate 1-1 gate oxide film 1-5 is formed to have a uniform thickness. Subsequently, a polysilicon layer functioning as word line 1-6 is formed on gate oxide film 1-5 through the use of well-known LPCVD (low pressure chemical vapor deposition) and anisotropic dry etching methods. Over the entire surface of silicon substrate 1-1 silicon oxide film 1-7 (or nitride or other suitable insulation film) is then formed by a CVD (chemical vapor deposition) method. First contact holes are formed in insulation film 1-7 above first impurity diffusion regions 1-8, which are located in active regions 1-3 of switching transistors that are present in every memory cell, and which will be electrically connected to stacked capacitors. Thereafter, as storage electrode 1-9, which is one of two electrodes of each stacked capacitor, and which will be connected to each corresponding impurity diffusion region 1-8, a polysilicon electrode is formed by using a well-known LPCVD method and an anisotropic dry etching method. As an insulation film for the stacked capacitors, oxide film 1-10 (which may be a nitride film, oxinitride film or a composite film thereof) is formed. As plate electrode 1-11, which is the other electrode of each stacked capacitor, a polysilicon electrode is formed by using a well-known LPCVD method and an anisotropic dry etching method. Another oxide film (or an nitride film or a composite film thereof) also is formed as insulation film 1-12, by using a CVD method. Insulation film 1-12 functions to electrically insulate the stacked capacitors from bit lines or other metal wiring formed thereon. Second contact holes are formed on insulation film 1-12 above second impurity diffusion regions 1-13, which are located in active regions 1-3 of the switching transistors that are present in every memory cell, and which will be electrically connected to bit lines. As pad conductor layer 1-14 for bit lines, another polysilicon (or polycide) layer is formed over and in the second contact holes as shown. Pad layer 14 could have been formed before the deposition of insulation film 1-12. Thereafter, a polycide or metal film serving as bit lines 1-15 is formed using an LPCVD method and an anisotropic dry etching method.

Although not shown, in the case of adding metal wiring to the structure formed as above-mentioned, additional oxide films (or nitride films or composite films thereof) are formed using a CVD method for insulating the metal wiring from the underlying structure. In this case, additional contact holes for selectively connecting bit lines, word lines, core circuits or peripheral circuits also are formed using an anisotropic dry etching method. Thereafter, metal wiring for selectively connecting the memory capacitors with core circuits or peripheral circuits are formed by using a coating achieved by a sputtering or CVD method and then a dry etching method. At this time, in the case of using a double metal wiring, a subsequent process required for forming a double metal wiring is carried out. Thus, all processes are completed. Additional processes such as lithography, cleaning and other associated processes or the like for improving the accuracy and ease in performing the processes described above may be performed as well. As the trend of further decreasing the entire chip area is continued in an effort to improve productivity and reduce cost, the area per cell could be reduced even more in the case of 16-mega-bit DRAMs or 64-mega-bit DRAMs. As a result, it is impossible to obtain a sufficiently large capacitance of stacked capacitors by using the above-mentioned method. Of course, the capacitance may be increased by an increase in the surface area of the capacitor obtained by increasing the height of the three-dimensional capacitor. However, this method has found limited use because of process difficulties resulting therefrom.

Accordingly, it is necessary to provide a method of making a stacked capacitor which is capable of increasing the surface area of the capacitor, without increasing the height.

Figure 2:
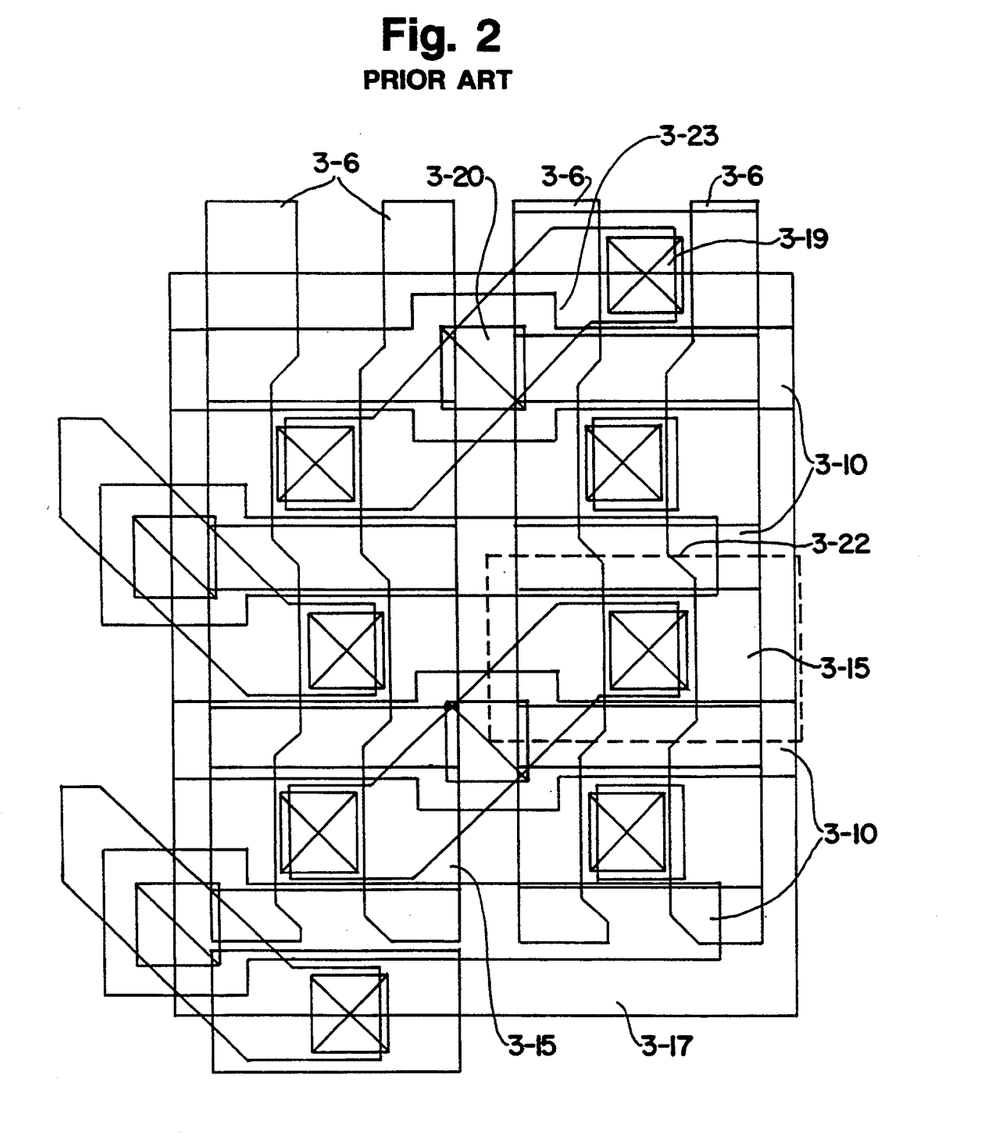
FIG. 2 is a layout plan view of a conventional DRAM having a folded bit line structure wherein each memory cell capacitor is disposed above each corresponding bit line.

FIG. 2 is a layout diagram of a DRAM obtained by a method for increasing the capacitance of a stacked capacitor. This layout is disclosed in U.S. Pat. No. 4,970,564 (issued Nov. 13, 1990 to Hitachi, Ltd.).

The method will now be described in conjunction with FIGS. 3(A) to 3(H) and FIG. 4.

Figure 3A:
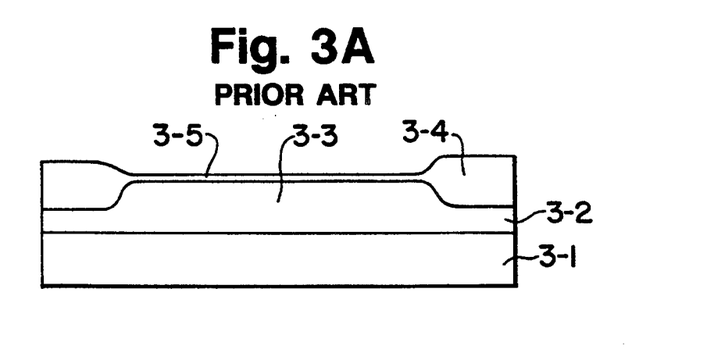
FIGS. 3(A) to 3(H) and FIG. 4 are sectional views illustrating a method of making the DRAM having the layout shown in FIG. 2.
Figure 3B:
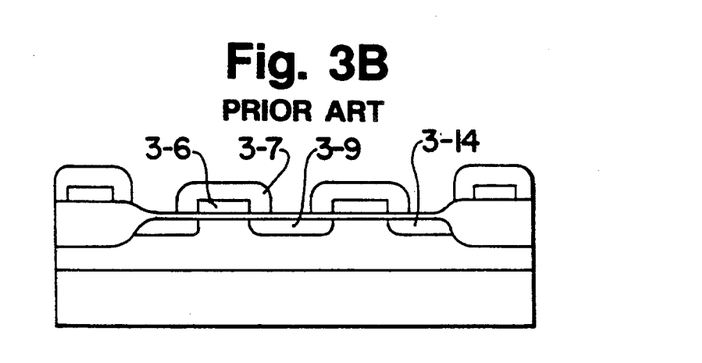
Figure 3C:
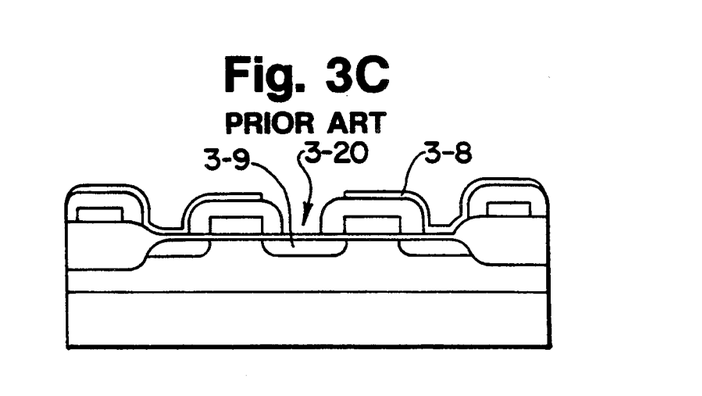
Figure 3D:
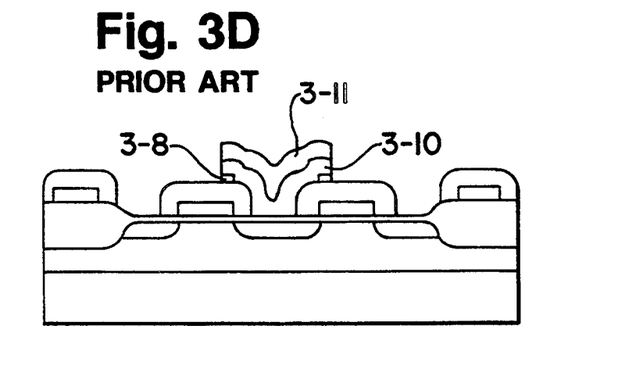
Figure 3E:
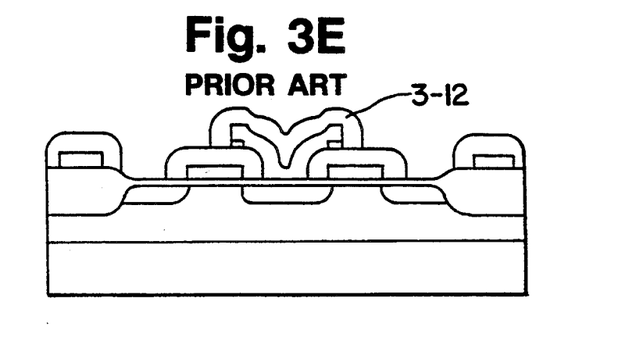
Figure 3F:
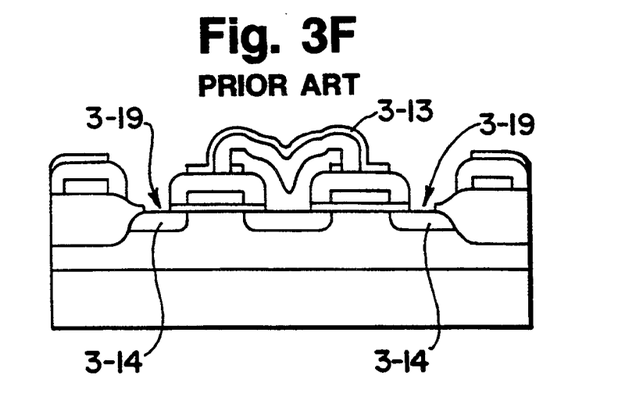
Figure 3G:
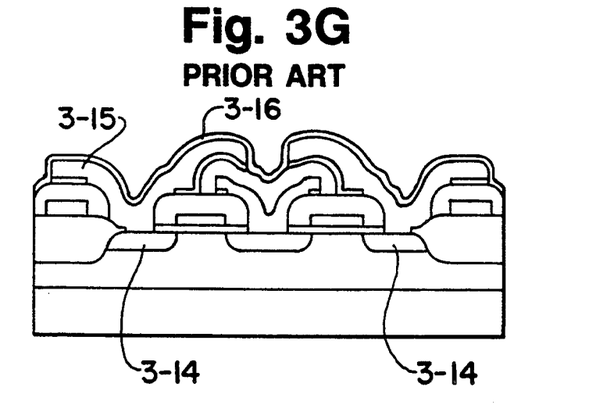
Figure 3H:
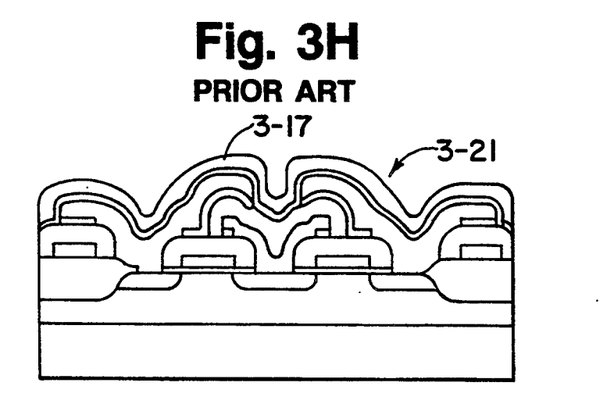
Figure 4:
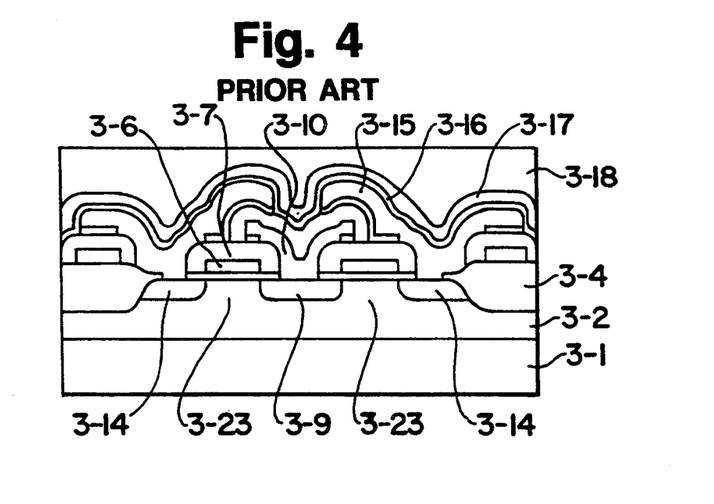

In accordance with this method, well 3-2 of a predetermined conductivity type (in CMOS devices, P type and N type wells) is first formed on silicon substrate 3-1, as shown in FIG. 3(A). Active regions 3-3 and field regions 3-4 are then formed on silicon substrate 3-1 by use of the improved LOCOS (local oxidation of silicon) method. Thereafter, gate oxide film 3-5 is formed over active regions 3-3. As shown in FIG. 3(B), a polysilicon layer functioning as word lines 3-6, and insulation film 3-7 for insulating adjacent layers from each other, are then formed on gate oxide film 3-5 by use of a well-known LPCVD method and a well-known anisotropic dry etching method. Over the entire surface of silicon substrate 3-1, a silicon oxide film (or nitride film or other insulation film) serving as insulation film 3-8 is then formed by use of a CVD method. Second contact holes are formed on insulation film 3-8 above second impurity diffusion regions 3-9, which are located in active regions of switching transistors that are present in every memory cell, and which will be electrically connected to bit lines, as shown in FIG. 3(C). Thereafter, a polysilicon (or polycide) wiring for providing bit lines 3-10, and insulation film 3-11 lying thereon are formed using an LPCVD method and a dry etching method, as shown in FIG. 3(D). Bit lines 3-10 are isolated from a layer which will be subsequently formed thereon, by using a conventional method of forming side wall oxide film 3-12, as shown in FIG. 3(E). Thereafter, another insulation film 3-13 is formed. On insulation film 3-13, first contact holes 3-19 are formed above first impurity diffusion regions 3-14, which are located in active regions 3-3 of the switching transistors that are present in every memory cell as shown in FIG. 3(F). Thereafter, as storage electrode 3-15, which is one of two electrodes of each stacked capacitor 3-21, and which is connected to each first impurity diffusion region 3-14, a polysilicon electrode is formed by using an LPCVD method and a dry etching method, as shown in FIG. 3(G). Insulation film 3-16 for stacked capacitors 3-21, which may be an oxide film (or a nitride film or a composite film thereof), is formed. As plate electrode 3-17 of each stacked capacitor 3-21, a polysilicon electrode is then formed by using an LPCVD method and a dry etching method, as shown in FIG. 3(H). Another oxide film 3-18 (or a nitride film or a composite film thereof) also is formed as an insulation film by using a CVD method. Oxide film 3-18 functions to electrically insulate stacked capacitors 3-21 from metal wiring, which will be formed thereon. The resulting structure is illustrated in FIG. 4.

Although not shown, additional contact holes are then formed at proper positions. Also, metal wiring for connecting circuits is formed over stacked capacitors 3-21 by use of a sputtering or CVD method and then defined by use of an anisotropic dry etching method. At this time, in cases in which double metal wiring is used, a subsequent process required for forming such double metal wiring is carried out. Thus, all processes are completed.

Other processes such as lithography, cleaning and other associated processes or the like for improving the accuracy and ease in performing the processes described above may be performed as well.

The memory cell having the above-mentioned structure of a stacked capacitor is very advantageous in extending the area of the capacitor, in that the first electrode of each stacked capacitor may be formed even above each second contact hole connecting the bit line and the second diffusion region of the corresponding switching transistor, because the stacked capacitor is formed after the formation of the bit lines as well as the word lines. Accordingly, the memory cell having the improved structure of stacked capacitors may be advantageously used in 16-mega bit DRAMs or higher density DRAMs.

With reference to FIG. 2, the memory cell will be described in further detail.

Below storage electrode 3-15 of stacked capacitor 3-21, first contact hole 3-19 is disposed, which connects storage electrode 3-15 with first impurity diffusion region 3-14 of the switching transistor. On the other hand, second contact hole 3-20 connecting bit line 3-10 with second impurity diffusion region 3-9 of the switching transistor is located at the lower left side of rectangular region 3-22. Between first contact hole 3-19 and second contact hole 3-20, word line 3-6 which functions as the gate of the switching transistor is vertically disposed. In this case, word line 3-6 should be positioned away from both first and second contact holes 3-19 and 3-20 by a proper distance so as to prevent the occurrence of electric short-circuiting therebetween. It is required that word line 3-6 be properly bent so that it can be disposed within the limited rectangular region under the condition that the proper distance is maintained. On the other hand, bit line 3-10 used for the input and output of information stored in the memory cell is disposed perpendicular to word line 3-6. Accordingly, entire active region 3-3, wherein three regions of the switching transistor are formed, that is, first impurity diffusion region 3-14, channel forming region 3-23 and second impurity diffusion region 3-9, are obliquely arranged with respect to bit line 3-10 and word line 3-6. There is no need for the three regions in the active regions to be linearly positioned. Arrangements having a curved or bent shape may be possible in order to obtain a desired process margin.

Common in all devices having a folded bit line structure, another word line 3-6 is disposed at the right side of first contact hole 3-19 within rectangular region 3-22 and in parallel to left word line 3-6, while maintaining a proper distance from first contact hole 3-19. Right word line 3-6 is not connected directly to the memory cell shown.

The positions of word lines 3-6 should be determined such that they keep a proper distance from other word lines in adjacent memory cells to be disposed at the left and right sides of rectangular region 3-22. Also, they should be positioned to be accurately connected with word lines in adjacent memory cells to be disposed above and below rectangular region 3-22. On the other hand, an adjacent bit line connected to an adjacent memory cell above rectangular region 3-22 is disposed in parallel to bit line 3-10 in rectangular region 3-22. Both the former and latter bit lines should be positioned to maintain a proper distance from first contact hole 3-19.

In considering the above-mentioned various arrangement conditions to obtain an optimum arrangement of the memory cell, it can be found that the arrangement of the memory cell shown in FIG. 2 encounters the following limitations.

First, second contact hole 3-20 for bit line 3-10 does not have a sufficient size, since the gap between adjacent word lines at which second contact holes 3-20 are located is small. This may cause a limitation in performance or it may become a limitation in achieving a high yield.

Second, since a self-aligning etching method using a word line side wall forming process is used, in case of forming second contact hole 3-20 for bit line 3-10, the separation between the subsequently formed bit line 3-10 and word line 3-6 is very small. As a result, the capacitance of bit line 3-10 becomes relatively large, thereby adversely affecting the operation of data sensing.

Third, since channel forming region 3-23 of the switching transistor forms an angle of 45° with respect to word line 3-6 (namely, the gate), it is difficult to determine the appropriate modeling of its characteristics. When the alignment of the gate and the active region is changed, the transistor characteristics may be affected.

Figure 5:
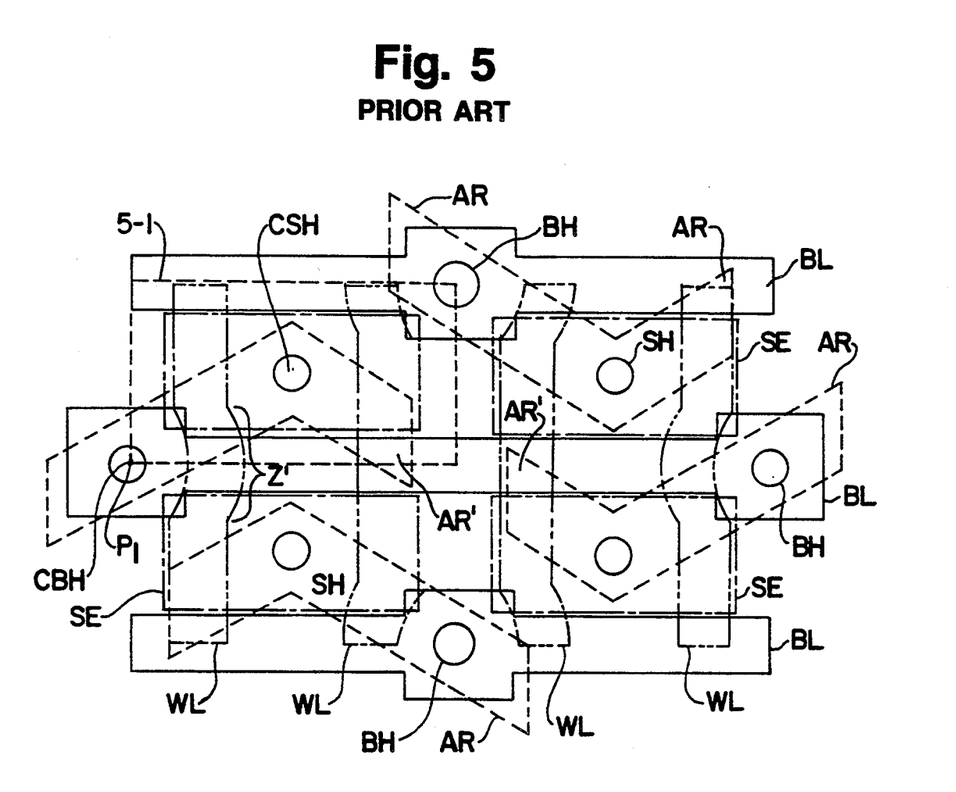
FIG. 5 is a layout plan view of another conventional DRAM having a folded bit line structure wherein each memory cell capacitor is disposed above each corresponding bit line.

Considering these limitations, another memory cell arrangement according to the layout of FIG. 5 seems to have an advantage, in that the limitations pointed out are eliminated by this arrangement. The layout is disclosed in U.S. Pat. No. 5,014,103 (issued on May 7, 1991 to Fujitsu, Ltd.).

Referring to FIG. 5, there is shown a layout in which four memory cells are arranged. In FIG. 5, reference character AR denotes active regions, reference character AR' denotes the bent portion of each active region AR, reference character WL denotes word lines, reference character BH denotes bit line contact holes, reference character BL denotes bit lines, reference character SH denotes storage electrode contact holes, reference character SE denotes storage electrodes, reference character Z' denotes the bent portion of each word line, reference character CBH denotes the center of each bit line contact hole, and reference character CSH denotes the center of each storage electrode contact hole.

As shown in FIG. 5, bent portion AR' of each active region AR is located under the corresponding word line WL. Bent portion Z' of each word line WL which crosses bit lines BL is curved as shown. The imaginary line connecting center CBH of each bit line contact hole BH and center CSH of the corresponding storage electrode contact hole SH is perpendicular to curved portion Z' of each word line WL. All of the memory cell patterns can be formed by arranging repeatedly the layout shown in FIG. 5.

In both cell arrangements shown in FIGS. 2 and 5, however, the centers of bit line contact holes 3-20 and BH should correspond to lower left corner points P1 of rectangular regions 3-22 and 5-1, respectively. This reason can be easily understood, considering the arrangement of memory cells at front, rear, left and right of a memory array.

However, this technique also has a limitation in the efficient arrangement of memory cells as will hereinafter be described in conjunction with FIG. 6.

SUMMARY OF THE INVENTION

Therefore, an object of the present invention is to eliminate the above-mentioned disadvantages encountered in the prior art structures and to provide a dynamic random access memory having an improved layout capable of increasing the integration degree by efficiently arranging essential elements of the memory cell within a limited area.

In accordance with the present invention, this object may be accomplished by providing a dynamic random access memory comprising: a semiconductor substrate having a plurality of active regions, with an active region located in every memory cell and including a first impurity diffusion region, a second impurity diffusion region in common with an adjacent memory cell, and a channel forming region located between the first and second impurity diffusion regions, the first impurity diffusion regions of adjacent active regions being located at positions symmetrical with respect to the common second impurity diffusion region; a plurality of uniformly spaced word lines formed on the semiconductor substrate, each of the word lines extending obliquely with respect to the channel forming region of each corresponding active region; a plurality of uniformly spaced bit lines formed on the semiconductor substrate and extending perpendicularly to the word lines, each of the bit lines having a center line extending obliquely with respect to the channel forming region of each corresponding active region; a plurality of capacitors each located longitudinally between two adjacent bit lines and laterally between two adjacent word lines; and an insulation layer having first contact holes for connecting the first impurity diffusion regions to the corresponding capacitors and second contact holes for connecting the second impurity diffusion regions to the corresponding bit lines, each of the second contact holes being arranged between respective first contact holes of two adjacent memory cells such that an imaginary line connecting them becomes a line bent at a predetermined angle, and is not a straight line.

Another object of the invention is to provide a dynamic random access memory having an improved layout capable of increasing the manufacturing yield by an increase in the process margin for forming bit line contact holes and reducing the capacitance of bit lines.

In accordance with the present invention, this object may be accomplished by providing a dynamic random access memory comprising: a plurality of active regions, with an active region located in every memory cell and including a first impurity diffusion region, a second impurity diffusion region in common with an adjacent memory cell, and a channel forming region located between the first and second impurity diffusion regions and extending obliquely with respect to a word line functioning as a gate and a bit line arranged adjacent thereto, the first impurity diffusion regions of two adjacent active regions being located at positions symmetrical with respect to the common second impurity diffusion region; a plurality of bit lines, which are perpendicular to the word lines, each having a protrusion extending from the main portion thereof in a direction corresponding to the extension direction of the word line, the location of the protrusion being in the corresponding second impurity diffusion region between respective channel forming regions of two adjacent memory cells, and at a desired area a bent portion adapted to keep the bit line away from the protrusion of the adjacent bit line, thereby preventing short-circuiting from occurring between the two bit lines; a plurality of capacitors each having short edges extending between two adjacent bit lines and long edges extending between two adjacent word lines, the lower one of the long edges being located along the main portion edge of the corresponding bit line from which the protrusion extends; and a plurality of word lines each having at a desired area a bent portion adapted to keep the word line away from a first contact hole for electrically connecting each first impurity diffusion region to each corresponding capacitor as well as a second contact hole for electrically connecting each second impurity diffusion region to each corresponding bit line, thereby preventing short-circuiting from occurring therebetween.

Another object of the present invention is to provide a method of arranging memory cells of the above-mentioned dynamic random access memory.

In accordance with the present invention, this object may be accomplished by providing a method of arranging memory cells of a dynamic random access memory which comprises: a semiconductor substrate having a plurality of active regions, with an active region located in every memory cell and including a first impurity diffusion region, a second impurity diffusion region in common with an adjacent memory cell, and a channel forming region located between the first and second impurity diffusion regions, the first impurity diffusion regions of adjacent active regions being located at positions symmetrical with respect to the common second impurity diffusion region; a plurality of uniformly spaced word lines; a plurality of uniformly spaced bit lines being orthogonal to the word lines, each bit line having a protrusion; a plurality of stacked capacitors each having a storage electrode; and an insulation layer having a plurality of first contact holes each electrically connecting the storage electrode of each stacked capacitor and each corresponding first impurity diffusion region and a plurality of second contact holes each electrically connecting each bit line and each corresponding second impurity diffusion region; the method comprising the steps of: selecting the position of each bit line protrusion as the position of each second impurity diffusion region in each corresponding active region; determining the position of the first impurity diffusion region in one of two adjacent active regions so that it corresponds to a position spaced away from the center line of each bit line protrusion in a longitudinal direction of the memory cell, at a predetermined distance and a predetermined angle; determining the position of the first impurity diffusion region in the other of two adjacent active regions so that it corresponds to a position that is symmetrical with the position of the first impurity diffusion region with respect to the center line of each bit line protrusion; determining the center of each first contact hole and the center of each second contact hole so that they correspond to the center of each first impurity diffusion region and the center of each second impurity diffusion region, respectively; and determining the size of each first contact hole and the size of each corresponding second contact hole so that the two contact holes keep away from all of word lines and bit lines arranged adjacent thereto, at a predetermined distance; and determining the center of the stacked capacitor so that it corresponds to the center of each corresponding first contact hole, thereby determining the position of each stacked capacitor in a region defined by two adjacent word lines and two adjacent bit lines.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 6A:
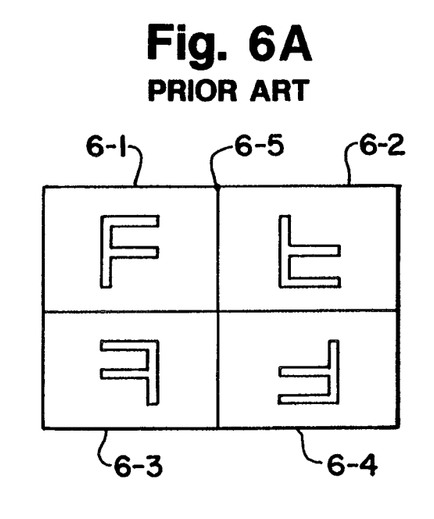
FIG. 6(A) is a view for explaining a conventional method of arranging memory cells.

FIG. 6(A) illustrates how the memory cells shown in FIGS. 2 and 5 are composed in a memory array. Reference numeral 6-1 denotes a region corresponding to rectangular region 3-22 of FIG. 2 or rectangular region 5-1 of FIG. 5. The letter F indicated in rectangular region 6-1 denotes the basic direction of the memory cell pattern. The character indicated in rectangular region 6-2 and shaped into an inverted F indicates that rectangular region 6-2 is a symmetrical mirror image of rectangular region 6-1 with respect to a long edge thereof. Similarly, the character indicated in rectangular region 6-3 and laterally inverted from the image of rectangular region 6-1 indicates that rectangular region 6-3 is a symmetrical mirror image of rectangular region 6-1 with respect to a short edge thereof. Finally, the character indicated in rectangular region 6-4 and laterally inverted from the image of rectangular region 6-2 indicates that rectangular region 6-4 is a symmetrical mirror image of rectangular region 6-2 with respect to a short edge thereof.

Figure 7:
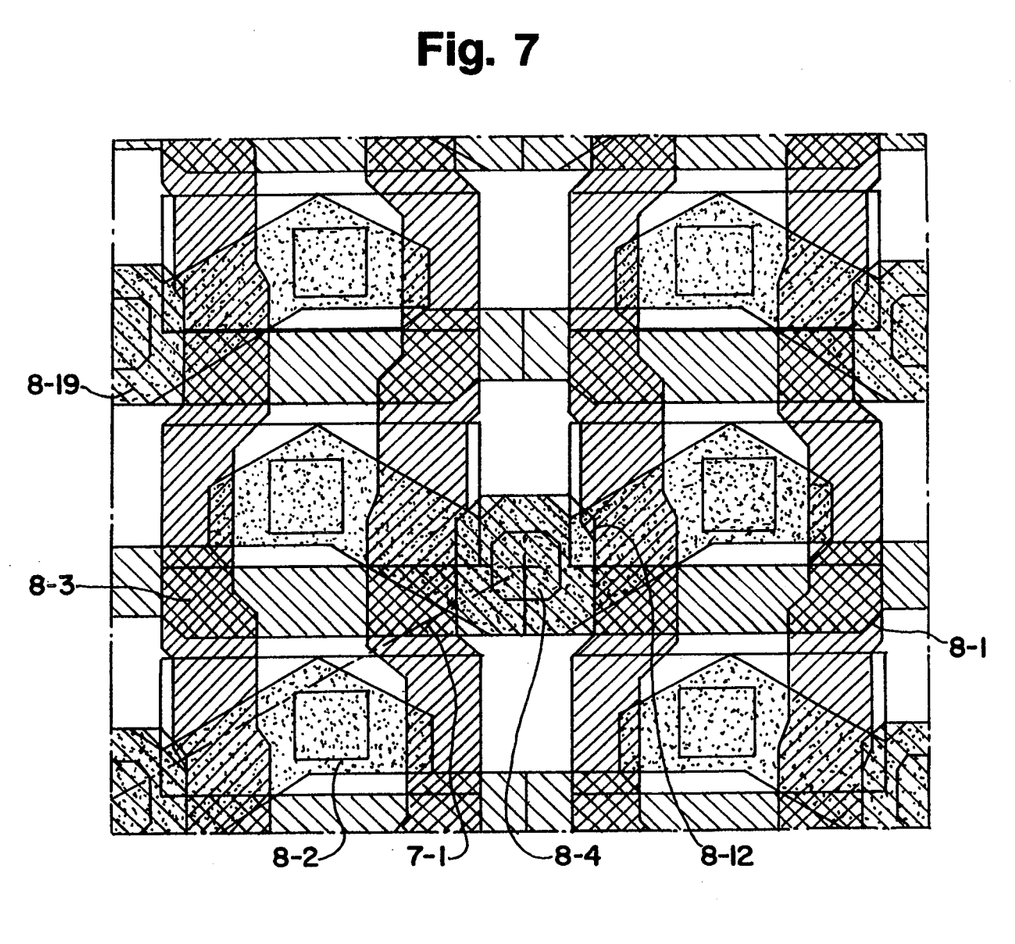
FIG. 7 is a layout plan view illustrating an arrangement of memory cells in accordance with an embodiment of the present invention.

In the arrangement illustrated in FIG. 6(A), the connection between adjacent memory cells can be achieved when the center of a second contact hole for connection of the bit line is located at corner point 6-5 of the rectangular regions. In accordance with embodiments of the present invention as illustrated in FIGS. 7 and 8, however, arrangement limitations may be satisfied without the necessity of the center of the second contact hole for bit line 8-3 being located at corner point 6-5 of FIG. 6(A), as contrasted with the layouts of FIGS. 2 and 5.

Figure 8:
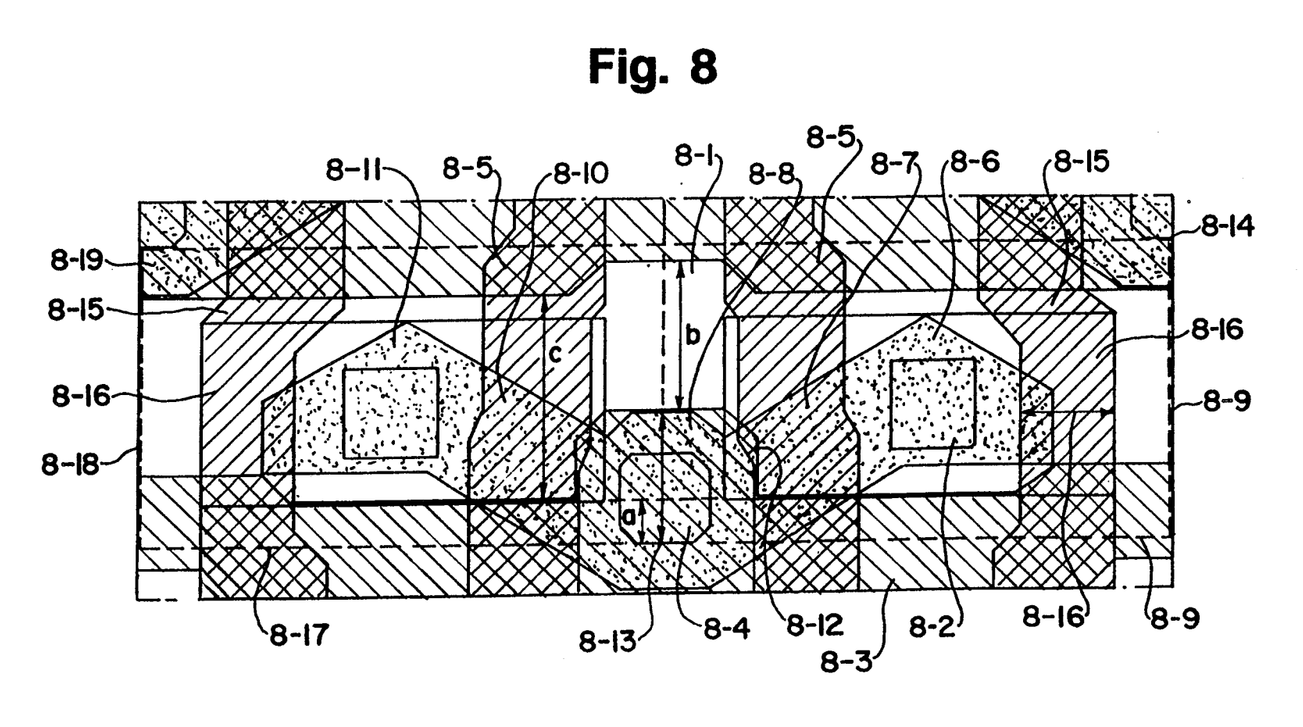
FIG. 8 is a view illustrating a part of the DRAM shown in FIG. 7.

FIG. 8 illustrates an embodiment of the present invention having two symmetrical basic memory cells with a common second contact hole 8-4 for bit line 8-3. The arrangement of memory cell elements in accordance with the present invention will now be described in detail in conjunction with FIG. 8.

First, center line 8-17 of bit line 8-3 is located at the lower edges of two rectangular regions 8-9 and 8-18, which are disposed laterally adjacent to each other. With this embodiment, there is no need for the center of bit line contact hole 8-4 to be located on center line 8-17 of bit line 8-3. The center of bit line contact hole 8-4 may be located such that it is positioned away from center line 8-17 of bit line 8-3 at a certain distance "a". In this case, however, bit line 8-3 needs protrusion 8-12 for fully covering second contact hole 8-4. Although the distance "b" between protrusion 8-12 and adjacent bit line 8-19 is less than the distance "c" between adjacent bit line 8-19 and portions of bit line 8-3 other than across from protrusion 8-12, this structure may not cause a shorting problem in actual applications. Even if the disclosed structure may be perceived to present a possibility of shorting, this concern may be readily addressed by designing adjacent bit line 8-19 such that its lower portion is slightly indented to have a curved portion 8-1 facing protrusion 8-12 as shown in FIG. 8.

As shown in FIG. 8, two adjacent active regions may be classified into five regions 8-6, 8-7, 8-8, 8-10 and 8-11, which may be referred to as a "sea gull wing" type memory cell structure as a result of the composite shape of these regions. Active region 8-8 corresponding to the body of the sea gull is shaped to cover sufficiently second contact hole 8-4. At active regions 8-7 and 8-10, corresponding to the inner wing portions of the sea gull, channel forming regions of the two switching transistors are located, respectively. Each channel forming region is obliquely arranged with respect to respective word line 8-5 at a predetermined angle. Based on experience, it is most advantageous that this angle be determined such that the channel forming region is parallel with a diagonal line connecting two corner points 8-13 and 8-14 of rectangular region 8-9. In actual applications, the angle may be on the order of 30°. Two word lines 8-5 and 8-15, which are arranged taking into consideration the arrangement limitations mentioned in conjunction with FIG. 4, are bent at their predetermined portions shown in FIG. 8 so that they are positioned away from first contact hole 8-2 located adjacent thereto at a predetermined distance. For the same purpose, the width of word line portion 8-16 also is varied. Each word line maintains a certain width in the channel forming region, so as to maintain the switch-off characteristic. In other areas, for instance, at word line portion 8-16, the word line has a minimum width allowed by the process, so as to increase the distance from first contact hole 8-2 adjacent thereto.

In the past, such a process for bending word lines 8-5 and 8-15 and varying the width thereof at several portions was regarded as undesirable due to the resultant increase in the quantity of data for the reticle mask manufacturing process. However, any such problem is reduced by virtue of the recently improved processing ability of computers and improved software. In the case of memory cells, any such problem also is reduced in that a small block can be data-processed and used repeatedly. Also, there is no problem in the reticle making process when electron beam machines are used.

At upper edges of rectangular regions 8-9 and 8-18 of the basic memory cells, bit line 8-19 of an adjacent memory cell is located. The position of first contact hole 8-2 for the first diffusion region is determined such that first contact hole 8-2 is positioned at least a predetermined distance from word lines 8-5 and 8-15 located on both sides of contact hole 8-2, and also from bit lines 8-19 and 8-3 located above and below first contact hole 8-2. The shape of the first diffusion regions in outer wing regions 8-6 and 8-11 corresponding to both ends of the sea gull should be designed such that the first diffusion regions cover the first contact hole wells while maintaining a proper distance from adjacent active regions.

FIGS. 7 and 8 exemplify only certain embodiments of the present invention. Accordingly, other shapes may be utilized in accordance with the present invention. For example, shapes obtained by inverting vertically the shapes of FIG. 8 may be utilized in accordance with the present invention.

Figure 6B:
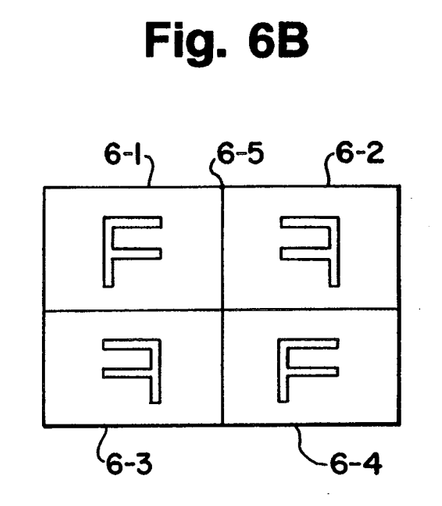
FIG. 6(B) is a view for explaining a method of arranging memory cells in accordance with the present invention.

Referring to FIG. 6(B), there is illustrated a method of arranging memory cells in a memory in accordance with the present invention. In this case, only laterally symmetrical patterns of basic memory cells are used, as compared with the arrangement illustrated in FIG. 6(A). Another embodiment of the present invention utilizing this method is illustrated in FIG. 7.

Figure 10:
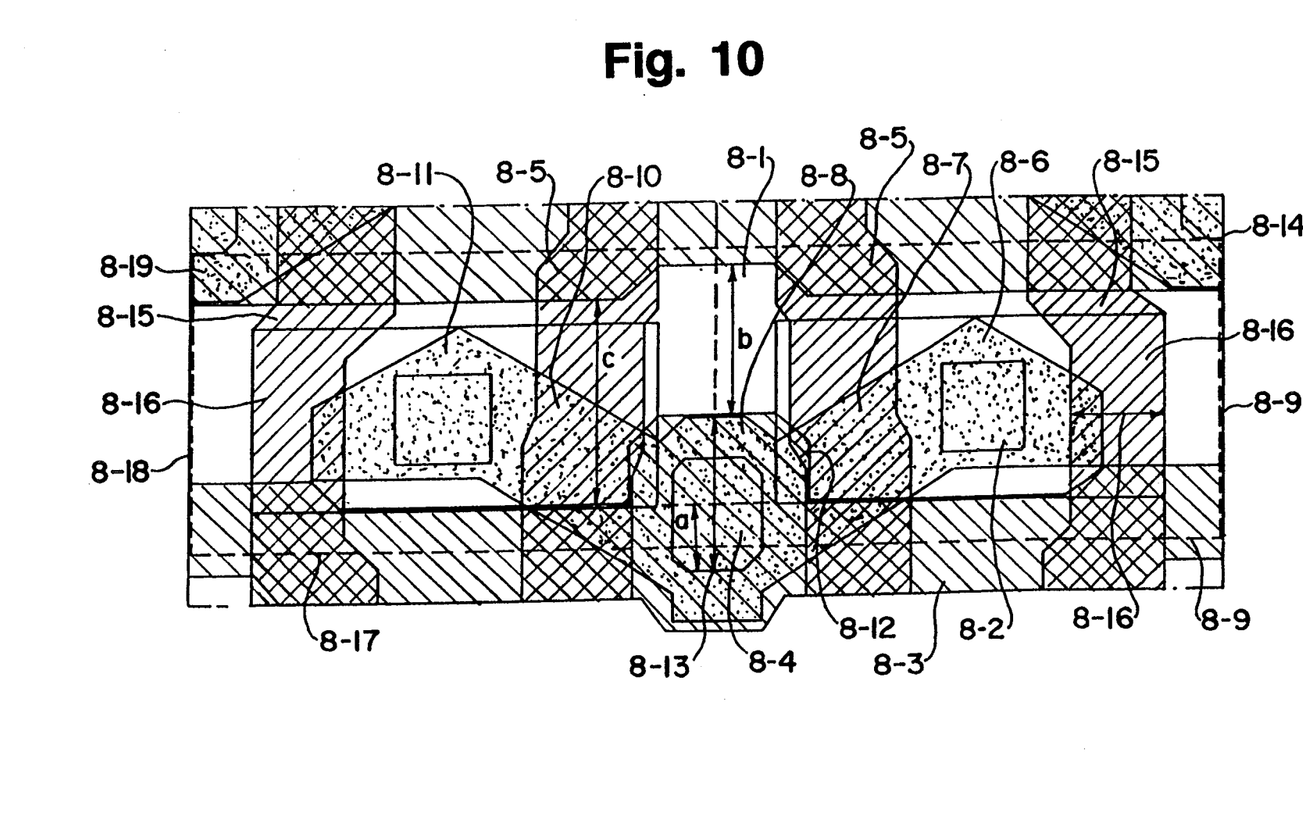
FIG. 10 is a layout plan view illustrating a part of a DRAM wherein the length of each bit line contact hole is extended, in accordance with another embodiment of the present invention.

FIG. 7 illustrates an example in which the possibility of short-circuiting is reduced by bending bit line 8-19 located adjacent to bit line 8-3 and facing protrusion 8-12 in the vicinity of second contact hole 8-4. In accordance with this embodiment, first contact hole 8-2 for first diffusion region is not located on imaginary line 7-1 connecting second contact holes 8-4 for two adjacent bit lines disposed diagonally at both sides of first contact hole 8-2. With this arrangement, the present invention has a concept different from those of FIGS. 2 and 5. With this arrangement, it is possible to extend the size of second contact hole 8-4 as shown in FIG. 10.

Figure 9:
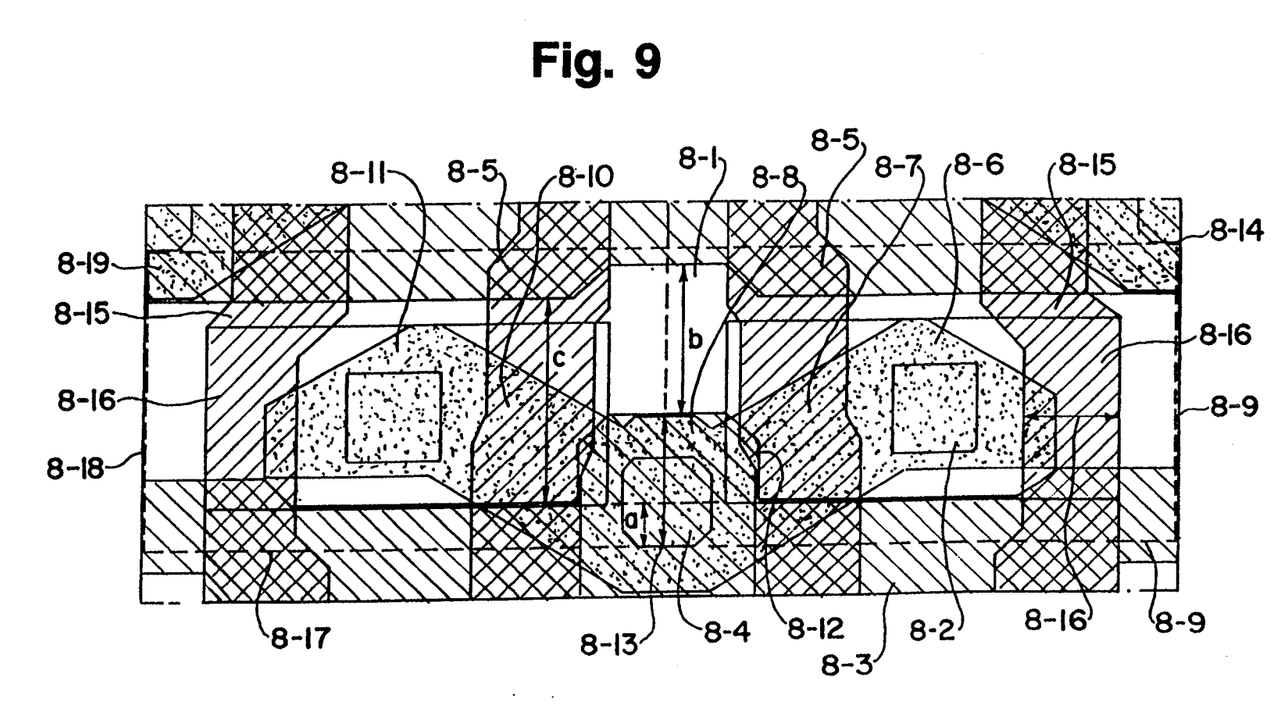
FIG. 9 is a layout plan view illustrating a part of a DRAM wherein the width of each active region is increased, in accordance with another embodiment of the present invention.

Referring to FIG. 9, it is illustrated that, if necessary, the width of each of the sea gull wings may be increased, irrespective of the distance between each sea gull wing and adjacent active regions, such as regions 8-7 and 8-10. This cannot be expected in the conventional layouts shown in FIGS. 2 and 5.

As apparent from the above description, the present invention enables the reduction of the possibility of short-circuiting while enabling the memory cells to be highly integrated.

Although preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A dynamic random access memory having a plurality of memory cells, comprising:

a semiconductor substrate having a plurality of active regions, wherein each memory cell includes an active region having a first impurity diffusion region, a second impurity diffusion region in common with an adjacent memory cell, and a channel forming region located between the first and second impurity diffusion regions, the first impurity diffusion regions of adjacent active regions being located at positions symmetrical with respect to the common second impurity diffusion region;

a plurality of uniformly spaced word lines formed on said semiconductor substrate, each of the word lines extending obliquely with respect to the channel forming region of each corresponding active region;

a plurality of uniformly spaced bit lines formed on the semiconductor substrate and extending perpendicularly to the word lines, each of the bit lines having a center line extending obliquely with respect to the channel forming region of each corresponding active region;

a plurality of capacitors each having a center located longitudinally between two adjacent bit lines and laterally between two adjacent word lines; and an insulation layer having first contact holes for connecting the first impurity diffusion regions to the corresponding capacitors and second contact holes for connecting the second impurity diffusion regions to the corresponding bit lines, each of the second contact holes being arranged between respective first contact holes of two adjacent memory cells such that an imaginary line connecting a second contact hole and adjacent first contact holes is bent at a predetermined angle and is not a straight line.

2. A dynamic random access memory as claimed in claim 1, wherein adjacent active regions form a sea gull wing shape including a body corresponding to the second impurity diffusion region in common with the two adjacent active regions, inner wing portions corresponding to the channel forming regions of the two adjacent active regions, and outer wing portions corresponding to the first impurity diffusion regions of the two adjacent active regions.

3. A dynamic random access memory as claimed in claim 2, wherein each first impurity diffusion region corresponding to each outer wing portion of the sea gull wing shape has an oblique upper surface facing adjacent active regions arranged adjacent thereto and an irregular width so that the first impurity diffusion region is positioned a predetermined distance away from the adjacent active regions arranged adjacent thereto.

4. A dynamic random access memory as claimed in claim 2, wherein the body, inner wing portions and outer wing portions of the sea gull wing shape have different widths from one another.

5. A dynamic random access memory as claimed in claim 2, wherein the end of each of the outer wing portions having the irregular width is disposed above the corresponding bit line.

6. A dynamic random access memory as claimed in claim 3, wherein each outer wing portion has an upper surface extending obliquely with respect to the center line of the bit line and a lower surface extending in parallel to the center line of the bit line.

7. A dynamic random access memory as claimed in claim 3, wherein the extension direction of the upper surface of each outer wing portion is opposite to that of the corresponding channel forming region.

8. A dynamic random access memory as claimed in claim 1, wherein the center of each second contact hole is located on the center line of the corresponding bit line, the center of each first contact hole is located on the center of the corresponding capacitor, and the size of each first contact hole is determined so that the first contact hole is positioned at least a predetermined distance away from the two word lines and the two bit lines arranged adjacent thereto.

9. A dynamic random access memory as claimed in claim 8, wherein the line connecting the center of each first contact hole and the center of each corresponding second contact hole is of V shape having a predetermined angle.

10. A dynamic random access memory as claimed in claim 1, wherein each channel forming region extends obliquely at an angle of about 30° with respect to the corresponding bit line and at an angle of about 60° with respect to the corresponding word line.

11. A dynamic random access memory having a plurality of memory cells, comprising:

a plurality of active regions, wherein each memory cell includes an active region having a first impurity diffusion region, a second impurity diffusion region in common with an adjacent memory cell and a channel forming region positioned between the first and second impurity diffusion regions and extending obliquely with respect to a word line functioning as a gate and a bit line arranged adjacent thereto, the first impurity diffusion regions of two adjacent active regions being located at positions symmetrical with respect to the common second impurity diffusion region;

a plurality of bit lines, the bit lines being perpendicular to the word lines with each bit line having a protrusion extending in a direction parallel to the word lines, the location of the protrusion being in the corresponding second impurity diffusion region between respective channel forming regions of two adjacent memory cells, and with each bit line having at a desired area a bent portion adapted to position the bit line away from the protrusion of an adjacent bit line, thereby preventing short-circuiting from occurring between the two bit lines;

a plurality of capacitors each having a center located between two adjacent bit lines and between two adjacent word lines; and a plurality of word lines each having at a desired area a bent portion adapted to maintain the word lines away from first contact holes, wherein the first contact holes serve to electrically connect each first impurity diffusion region to each corresponding capacitor, the bent portion also adapted to maintain the word lines away from second contact holes, wherein the second contact holes serve to electrically connect each second impurity diffusion region to each corresponding bit line, thereby preventing short-circuiting from occurring therebetween.

12. A dynamic random access memory as claimed in claim 11, wherein the second impurity diffusion region and the second contact hole are located at a portion of the corresponding bit line at which the protrusion is disposed.

13. A dynamic random access memory as claimed in claim 12, wherein the center of the second contact hole is elongated along the center line of the width of the protrusion, where the direction of the center line of the width of the protrusion is the same as the direction of the protrusion, and the center line is orthogonal to the center line of the bit line.

14. A dynamic random access memory as claimed in claim 11, wherein the shape of the first contact hole is similar to that of the capacitor and the shape of the second contact hole is approximately identical to that of the bit line protrusion.

15. A dynamic random access memory as claimed in claim 14, wherein the shape of the first contact hole approximates a rectangular shape and the shape of the second contact hole approximates a circular shape.

16. A dynamic random access memory as claimed in claim 11, wherein the first impurity diffusion region, the second impurity diffusion region and the channel forming region constituting one active region are not aligned with one another in a linear manner, thereby providing a process margin.

17. A dynamic random access memory as claimed in claim 11, wherein the channel region extends obliquely at an angle of about 30° with respect to the corresponding bit line and at an angle of about 60° with respect to the corresponding word line.

18. A dynamic random access memory as claimed in claim 11, wherein the protrusion of each bit line does not extend beyond the line connecting centers of first contact holes of two adjacent memory cells which share the same second contact holes.

19. A dynamic random access memory as claimed in claim 11, wherein each word line has a uniform width at its portion located in each corresponding channel forming region of two adjacent active regions symmetrically arranged with each other, thereby maintaining the switch-off characteristic of the resulting transistor, and at its portion located next to the first impurity diffusion region of an adjacent memory cell a bent portion having a width varying such that the word line is maintained away from the adjacent active regions of neighboring memory cells at a predetermined distance.

20. A dynamic random access memory as claimed in claim 11, wherein the center of the first contact hole corresponds to the center of the corresponding capacitor.

21. A dynamic random access memory as claimed in claim 11, wherein each memory cell is disposed within a rectangular region, wherein the direction that the channel forming region of a memory cell extends is approximately parallel to a diagonal line of the rectangular region in which the memory cell is disposed.

22. A dynamic random access memory as claimed in claim 21, wherein each memory cell is disposed within a rectangular region defined by connecting respective lower edge centers of two second contact holes arranged diagonally adjacent to each other.

23. A dynamic random access memory as claimed in claim 11, wherein the bent portion of each bit line has a shape similar to the upper portion of the protrusion of adjacent bit line.

* * * * *